(12) United States Patent
Kao

(10) Patent No.: US 8,039,286 B2
(45) Date of Patent: Oct. 18, 2011

(54) METHOD FOR FABRICATING OPTICAL DEVICE

(75) Inventor: Ching-Hung Kao, Hsinchu (TW)

(73) Assignee: United Microelectronics Corp., Hsinchu (TW)

(*) Notice: Subject to any disclaimer, the term of this patent is extended or adjusted under 35 U.S.C. 154(b) by 112 days.

(21) Appl. No.: 12/544,204

(22) Filed: Aug. 19, 2009

(65) Prior Publication Data

US 2011/0045626 A1    Feb. 24, 2011

(51) Int. Cl.
*H01L 21/00* (2006.01)
(52) U.S. Cl. ....... 438/57; 438/69; 438/70; 257/E21.211; 257/E31.127
(58) Field of Classification Search ............... 438/57, 438/70, 69; 257/E21.211, E31.127
See application file for complete search history.

(56) References Cited

U.S. PATENT DOCUMENTS

| | | | |
|---|---|---|---|
| 6,006,764 A | 12/1999 | Chu et al. | |
| 6,297,160 B1 | 10/2001 | Chien | |
| 6,338,976 B1 | 1/2002 | Huang et al. | |
| 6,765,277 B2 | 7/2004 | Chen et al. | |
| 6,849,533 B2 | 2/2005 | Chang et al. | |
| 7,678,604 B2 * | 3/2010 | Kim | 438/69 |
| 2004/0002178 A1 * | 1/2004 | Fasen et al. | 438/57 |
| 2008/0111159 A1 * | 5/2008 | Gambino et al. | 257/225 |

* cited by examiner

*Primary Examiner* — Alexander G Ghyka
*Assistant Examiner* — Seahvosh J Nikmanesh
(74) *Attorney, Agent, or Firm* — Chun-Ming Shih

(57) ABSTRACT

A method for fabricating an optical device includes providing a semiconductor substrate having an element region and a peripheral region. The element region has an element array comprised of semiconductor elements formed therein. The peripheral region has at least a bonding pad electrically connected to the element array. A dielectric layer with an opening exposing the bonding pad is formed over the semiconductor substrate. A filter array and a planarizing layer are sequentially formed on the dielectric layer, and an organic layer is filled into the opening. An inorganic layer is formed on the planarizing layer and covers the organic layer. A portion of the inorganic layer and the organic layer are sequentially removed until the bonding pad is exposed. The organic layer protects the bonding pad from corrosion during the step removing the inorganic layer, and thus the fabrication yield is improved.

20 Claims, 5 Drawing Sheets

METHOD FOR FABRICATING OPTICAL DEVICE

BACKGROUND

1. Technical Field

The present invention generally relates to a method for fabricating an optical device and more particularly to a method for fabricating an optical device for improving the fabrication yield.

2. Description of the Related Art

With the continuous development and growth of electronic commodities such as cameras and scanners, the demand of image sensors is continuing to increase in the consumer market. Nowadays commonly used image sensors include charge coupled device (CCD) and CMOS image sensor (CIS). Since the CMOS image sensor has the advantages of low operating voltage, low power consumption, high operation efficiency and random access, it can be integrated with the current semiconductor technology for mass production, and therefore it is widely applied.

FIG. 1A and FIG. 1B are schematic cross-sectional views of a conventional CMOS image sensor illustrating process steps of a fabricating process. Referring to FIG. 1A, first, a dielectric layer 130, a filter array 150, a planarizing layer 160 and a micro-lens array 170 are sequentially formed over an element region 102 of a semiconductor substrate 100. The element region 102 of the semiconductor substrate 100 has a plurality of photosensitive elements 110 formed therein. A circuit pattern 120 and a bonding pad 140 electrically connected with the circuit pattern 120 are formed over a peripheral region 104 of the semiconductor substrate 100 has. The dielectric layer 130 has an opening 132 exposing the bonding pad 140.

Referring to FIG. 1B, a protective layer 180 is subsequently formed over the micro-lens array 170 for protecting the micro-lens array 170 from damage by particulates or other contamination sources. Since the protective layer 180 is also filled into the opening 132 and covers the bonding pad 140, an etching process is required to remove a portion of the protective layer 180 to expose the bonding pad 140 to facilitate the electrical connection of circuit pattern 120 with an external circuit in the subsequent process.

Generally speaking, the protective layer 180 is made of an inorganic material such as silicon oxide, silicon nitrogen or silicon oxynitride, and a dry etching using a fluorine-containing gas is performed to remove the portion of the protective layer 180 to expose the bonding pad 140. However, during the dry etching process, the fluorine-containing gas residues may adhere on the bonding pad 140, corrode the bonding pad 140, and result in the formation of indent or unevenness on the surface of the boning pad 140 leading to poor electrical connection between the bonding pad 140 and other element. Accordingly, it is necessary to use a cleaning process to remove the fluorine-containing gas residues on the bonding pad 140.

However, current chemical solvents used in the cleaning process for removing the fluorine-containing gas residues would cause peeling of the photo-resist material in the filter array 150, the planarizing layer 160 and the micro-lens array 170. Therefore, how to effectively remove the residual fluorine-containing gas residues on the bonding pad 140 without adversely influencing other elements or layers of the device is presently one of urgent issues that need to be resolved in the fabrication process of the CMOS image sensor.

Additionally, during the fabrication of conventional liquid crystal on silicon (LCOS) display panel, the above-mentioned issue is also encountered.

BRIEF SUMMARY

Accordingly, the present invention is directed to a method for fabricating an optical device, which may reduce the possibility of damage to the bonding pad of the optical device and increase the fabrication yield.

A method for fabricating an optical device in accordance with an embodiment of the present invention includes providing a semiconductor substrate having an element region and a peripheral region formed thereon. The element region comprises an element array including a plurality of semiconductor elements formed therein, and the peripheral region comprises at least a bonding pad electrically connected to the element array. Next, a dielectric layer having an opening is formed over the semiconductor substrate, wherein the opening exposes the bonding pad. A filter array is formed over the dielectric layer and the element region. A planarizing layer is formed covering the dielectric layer and the filter array. An organic layer is filled into the opening of the dielectric layer and covers the bonding pad, and an inorganic layer is formed on the planarizing layer and covers the organic layer. Subsequently, a portion of the inorganic layer is removed to expose the organic layer, and then the organic layer is removed to expose the bonding pad.

In one embodiment of the present invention, a micro-lens array corresponding to the filter array is formed over the planarizing layer, and then the inorganic layer is formed to cover the micro-lens array.

In one embodiment of the present invention, the organic layer is simultaneously filled into the opening of the dielectric layer together with the formation of at least one of the filter array, the planarizing layer and the micro-lens array. Moreover, the material of the organic layer is the same as that of, for example, the filter array, the planarizing layer and the micro-lens array.

In one embodiment of the present invention, the process for forming the micro-lens array includes, for example, forming a patterned polymer layer over the planarizing layer and then performing a drying process over the patterned polymer layer.

In one embodiment of the present invention, the organic layer is filled into the opening of the dielectric layer after the formation of the micro-lens array.

In one embodiment of the present invention, the organic layer is filled into the opening of the dielectric layer before the formation of the micro-lens array. Moreover, the organic layer is, for example filled into the opening of the dielectric layer after the formation of the planarizing layer but before the formation of the micro-lens array. Of course, the organic layer may be filled into the opening of the dielectric layer after the formation of the filter array but before the formation of the planarizing layer. In addition, the organic layer may be filled into the opening of the dielectric layer before the formation of the filter array.

In one embodiment of the present invention, the semiconductor elements comprise photosensitive elements.

In one embodiment of the present invention, the semiconductor elements comprise CMOS transistors.

In one embodiment of the present invention, the element region further comprises a plurality of insulation structures formed therein. The insulation structures may be arranged between the respective semiconductor elements. A process for forming the insulation structures may include a shallow trench insulation process.

In one embodiment of the present invention, the filter array includes a plurality of red filter patterns, a plurality of green filter patterns and a plurality of blue filter patterns.

In one embodiment of the present invention, the organic layer is filled into the opening of the dielectric layer during the formation of at least one of the red filter patterns, the green filter patterns and the blue filter patterns. Moreover, the material of the organic layer is the same as that of the at least one of the red filter patterns, the green filter patterns and the blue filter patterns.

In one embodiment of the present invention, the process for removing the portion of the inorganic layer includes forming a patterned photoresist layer on the inorganic layer, wherein the patterned photoresist layer exposes the portion of the inorganic layer directly above the opening of the dielectric layer; etching the portion of the inorganic layer over the opening using the patterned photoresist layer as mask; and removing the patterned photoresist layer.

In one embodiment of the present invention, a fluorine-containing gas is used as etching gas in the etching process.

In one embodiment of the present invention, the patterned photoresist layer and the organic layer are removed in the same process.

In one embodiment of the present invention, the step for removing the organic layer includes a dry etching process.

During the fabrication of the optical device in accordance with the present invention, since the organic layer is first formed to cover the bonding pad before the formation of the inorganic layer, and therefore the bonding pad may be protected from being exposed to the fluorine-containing gas used for etching the inorganic layer, and therefore the possibility of damage to the bonding pad due to the fluorine-containing gas may be effectively reduced. Thus, the reliability of the electrical connection between the bonding pad and other element during the subsequent wire bonding process may be effectively improved. Furthermore, the organic layer and at least one of the filter array, the planarizing layer and the micro-lens array may be simultaneously formed on the bonding pad during forming so that the fabrication cost may be reduced.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1A:
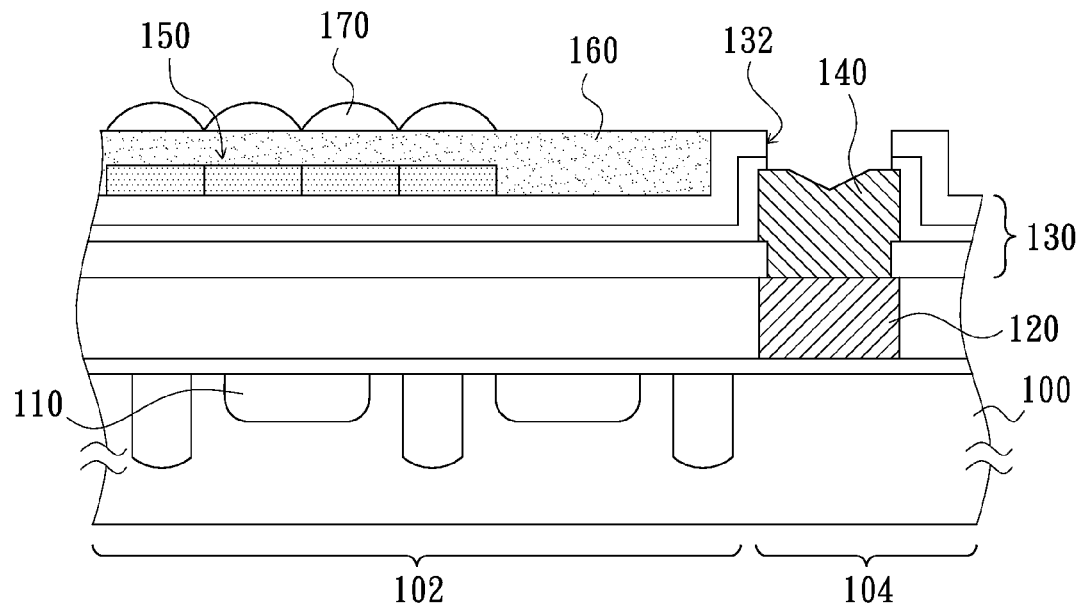
FIGS. 1A and 1B are schematic cross-sectional views illustrating the process steps of a conventional process for fabricating a CMOS image sensor.
Figure 1B:
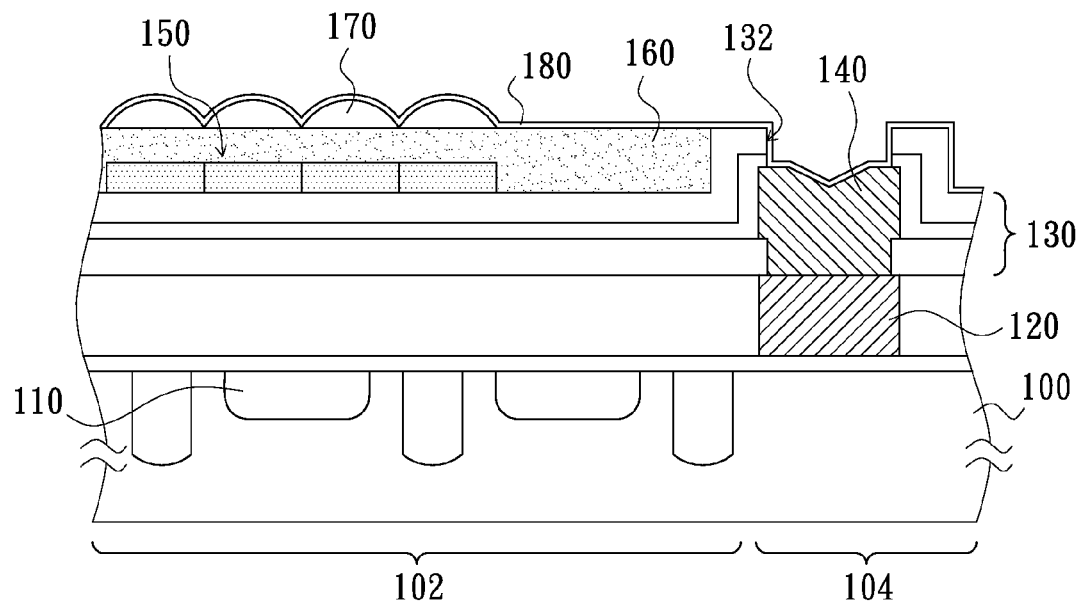
Figure 2A:
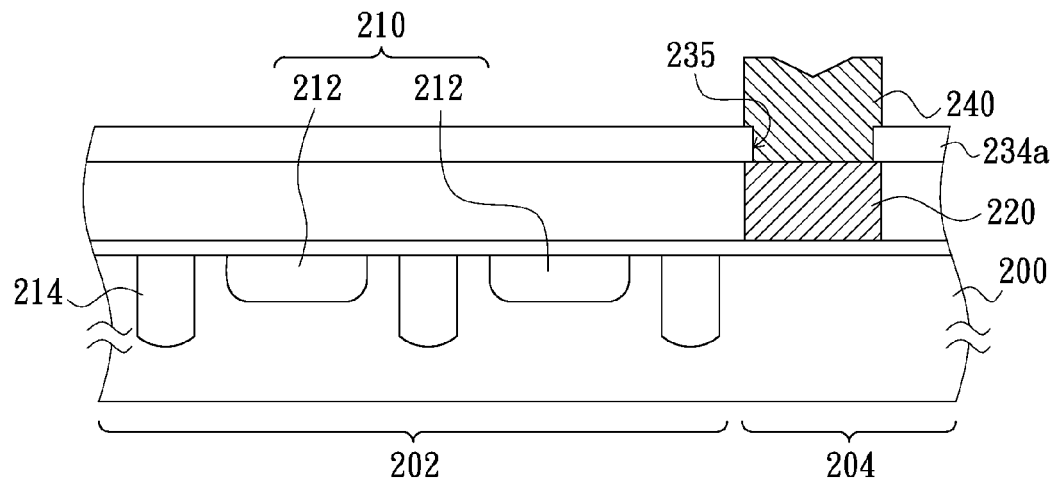
FIGS. 2A through 2F are schematic cross-sectional views illustrating the process steps of a process for fabricating an optical device in accordance with an embodiment of the present invention.

FIGS. 2A through 2F are schematic cross-sectional views illustrating the process steps of a process for fabricating an optical device in accordance with an embodiment of the present invention. Referring to FIG. 2A, a semiconductor substrate 200 having an element region 202 and a peripheral region 204 is provided. The element region 202 comprises an element array including a plurality of semiconductor elements 212 formed thereon. The peripheral region 204 comprises at least a bonding pad 240 formed thereon. More specifically, the bonding pad 240 is formed over a circuit pattern 220. The circuit pattern 220 is, for example, electrically connected to the element array 210 formed in the element region 202 (not shown). The material of the circuit pattern 220 includes, for example, copper or other metal with excellent electrical conduction properties. The material of the bonding pad 240 includes, for example aluminum or other metal with similar electrical characteristics.

In the present embodiment, the semiconductor elements 212 include, for example, photosensitive elements including, for example, photodiodes fabricated by a CMOS process. In other words, the optical device fabricated by the method proposed in the present embodiment can be a CMOS image sensor (CIS). In other embodiments, the semiconductor elements 212 can be CMOS transistors. That is to say, the method proposed in the present embodiment may also be adapted to fabricate a driving array substrate of a liquid crystal on silicon (LCOS) display panel, however the present invention as such is not limited to these embodiments.

In addition, adjacent semiconductor elements 212 are insulated from each other by, for example, an insulation structure 214 there-between. The process for forming the insulation structure 214 may include a well known shallow trench insulation (STI) process; and the detailed process steps thereof is not be reiterated herein.

Figure 2B:
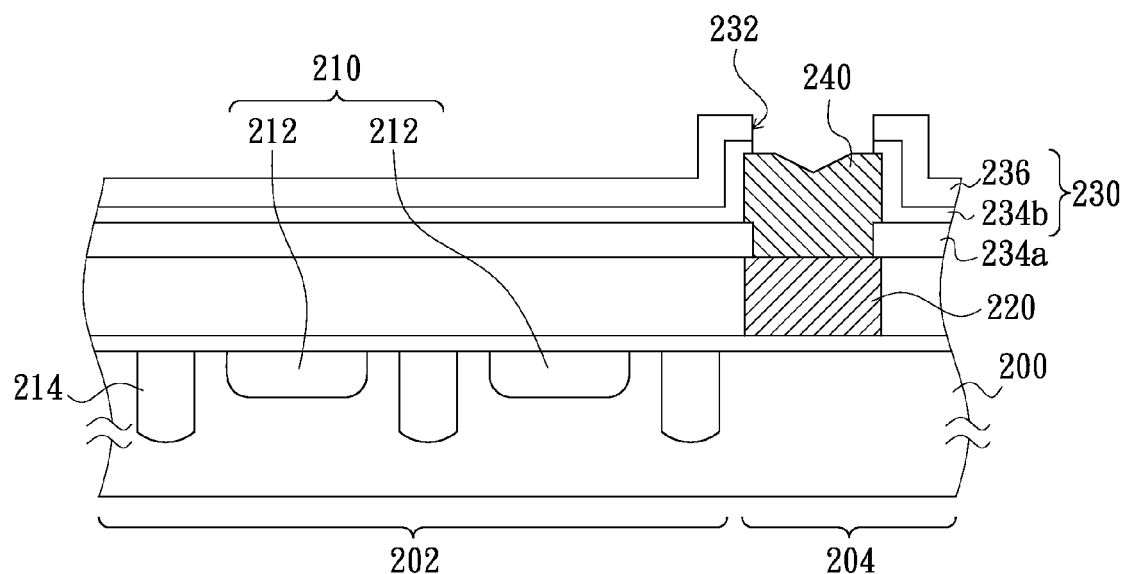

Referring to FIG. 2B, a dielectric layer 230 having an opening 232 is formed over the semiconductor substrate 200. The opening 232 exposes the bonding pad 240. In particular, the dielectric layer 230 may be a single layer structure or a composite layer structure including a plurality of material layers. In the present embodiment, the dielectric layer 230 includes, for example a composite layer structure comprising an oxide layer 234b and a silicon nitride layer 236, and however the present invention is as such not limited thereto.

Figure 2C:
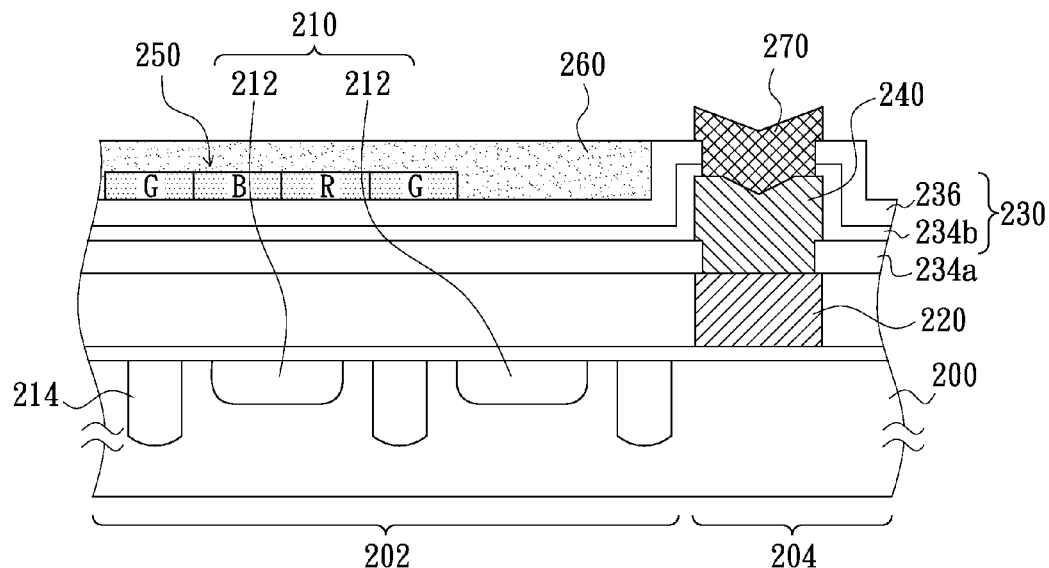

Referring to FIG. 2C, a filter array 250 and a planarizing layer 260 are sequentially formed over the dielectric layer 230, and an organic layer 270 is filled into the opening to cover the bonding pad 240. The planarizing layer 260 covers the dielectric layer 230 and the filter array 250. The filter array 250 corresponds to the element array 210 and is generally comprised of a plurality of red filter patterns R, a plurality of green filter patterns G and a plurality of blue filter patterns B.

The material of the filter array 250 and the material of the planarizing layer 260 may both include an organic material, e.g., a photoresist material. Therefore, the organic layer 270 covering over the bonding pad 240 and at least one of the filter arrays 250 and the planarizing layer 260 may be formed in the same process. That is to say, the material of the organic layer 270 may be same as that of the at least one of the filter array 250 and the planarizing layer 260. In present embodiment, the organic layer 270 may be, for example, formed in the same process with the filter array 250. More specifically, in the present embodiment, the organic layer 270 can be simultaneously formed in the opening 232 along with the formation of at least one of the red filter patterns R, the green filter patterns G and the blue filter patterns B. In this situation, the material of the organic layer 270 is the same as that of the at least one of the red filter patterns R, the green filter patterns G and the blue filter patterns B.

Figure 2D:
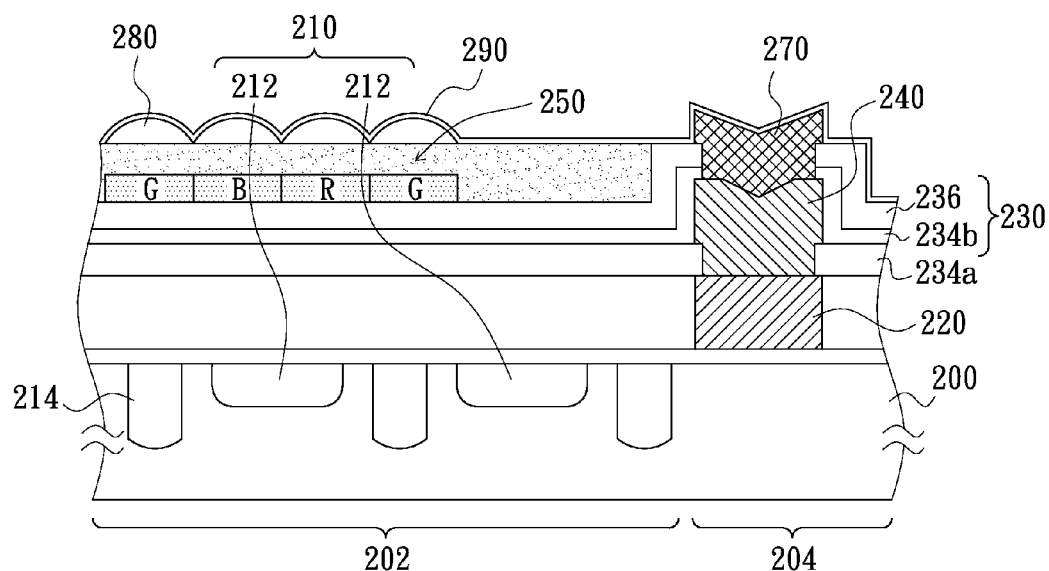

Referring to FIG. 2D, in the present embodiment, after the formation of the planarizing layer 260, a micro-lens array 280 is first formed over the planarizing layer 260 and then an inorganic layer 290 is formed covering the micro-lens array 280 to protect the micro-lens array 280 from the contamination. A process temperature for forming the inorganic layer 290 may be preferably controlled in a range that would not adversely influence the filter array 250, the planarizing layer 260 and the micro-lens array 280. In the present embodiment, the process temperature for forming the inorganic layer 290 may be controlled in a range, for example, below 200 Celsius degrees.

Figure 3:
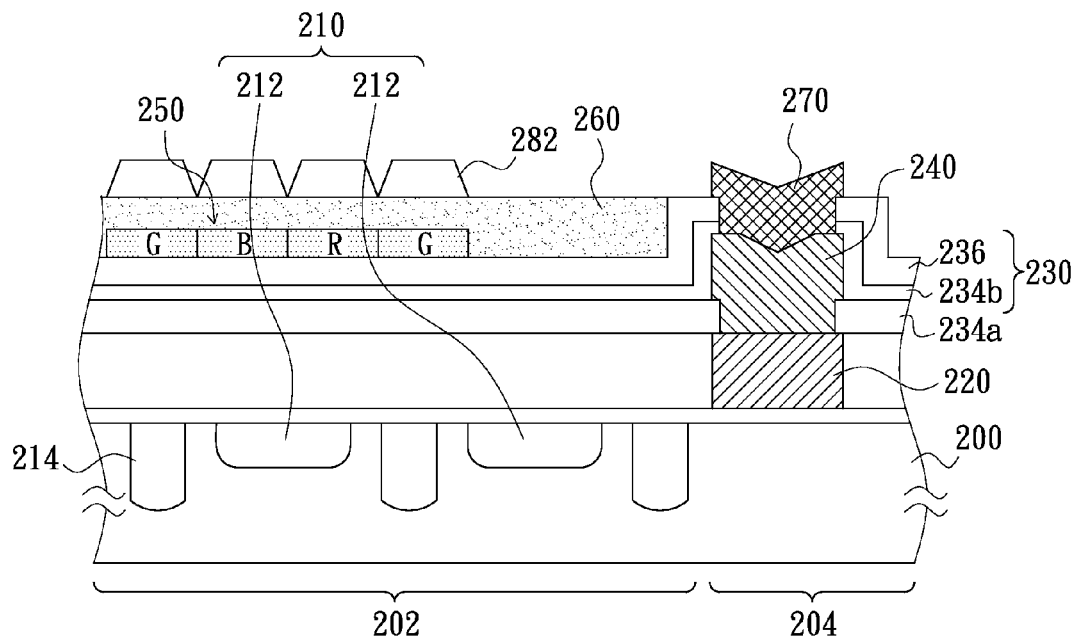
FIG. 3 is a schematic cross-sectional view illustrating one of the process steps of a process for fabricating an optical device in accordance with another embodiment of the present invention.

The micro-lens array 280 corresponds to the filter array 250. The step of forming the micro-lens array 280 includes, for example, forming a patterned polymer layer 282 (as shown in FIG. 3) over the planarizing layer 260 and then performing a drying process over the patterned polymer layer 282.

Figure 4:
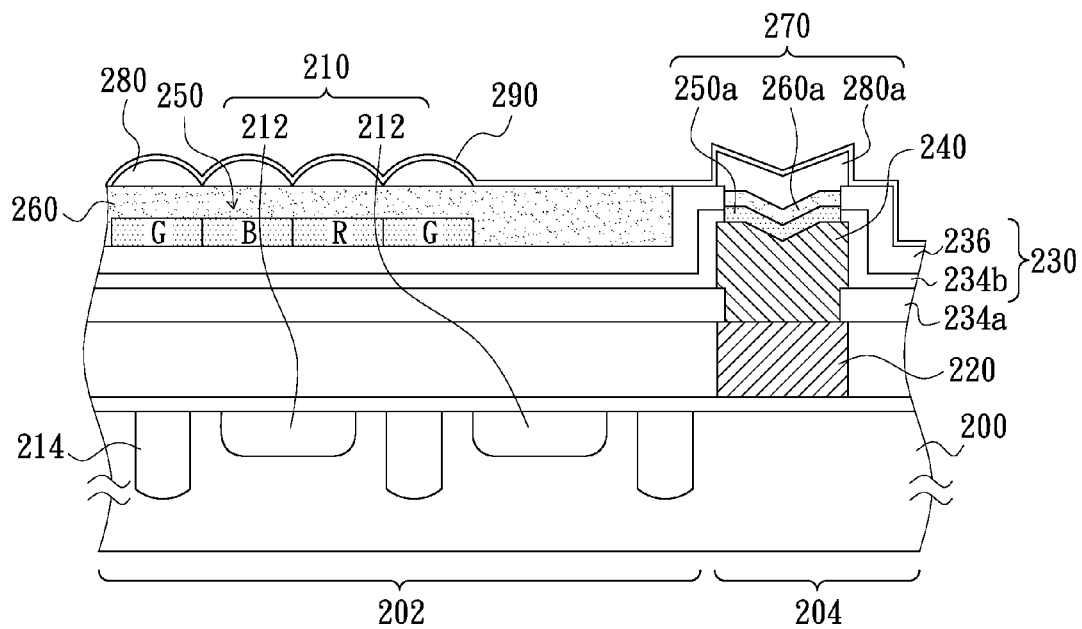
FIG. 4 is a schematic cross-sectional view illustrating one of the process steps of a process for fabricating an optical device in accordance with still another embodiment of the present invention.

Particularly, the material of the micro-lens array 280 may also include an organic material, and in other embodiments, the organic layer 270 over the bonding pad 240 may be formed together with the formation of the micro-lens array 280. Thus, the organic layer 270 may be comprised of a single layer structure including a material same as that of the filter array 250, the planarizing layer 260 or the micro-lens array 280, or a composite layer structure including layers 250a, 260a and 280a (as shown in FIG. 4), however, the present invention is as such not limited to these examples. The layer 250a is simultaneously formed with the filter array 250, the layer 260a is simultaneously formed with the planarizing layer 260, and the layer 280a is simultaneously formed with the micro-lens array 280.

In addition, the organic layer 270 may be formed by an independent process instead before the formation of the inorganic layer 290. For example, the organic layer 270 may be formed before the formation of the filter array 250, or after the formation of the filter array 250 but before the formation of the planarizing layer 260, or after the formation of the planarizing layer 260 but before the formation of the micro-lens array 280, or after the formation of the micro-lens array 280. Thus, one skilled person in the art may freely choose formation of the organic layer 270 according to practical requirements.

Figure 2E:
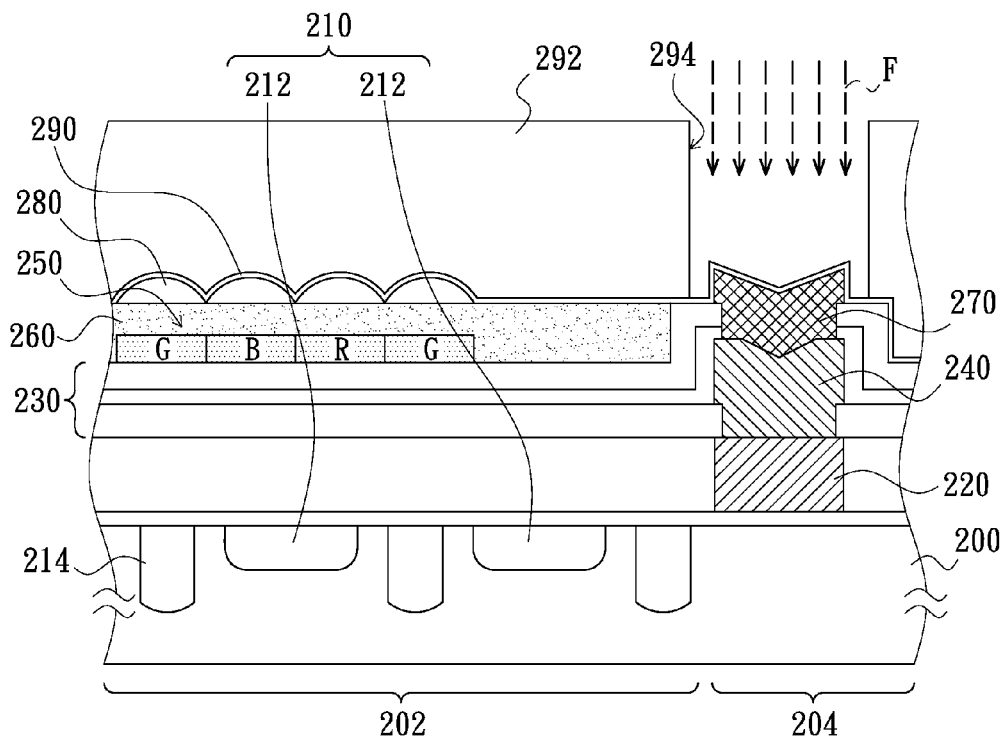
Figure 2F:
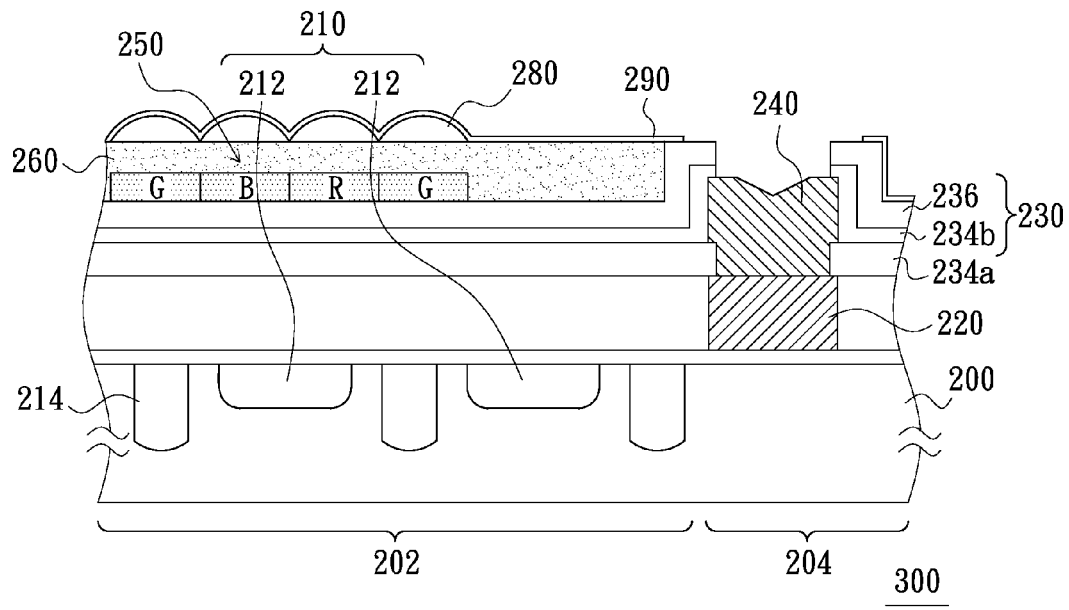

Referring to FIGS. 2E and 2F, a portion of the inorganic layer 290 above the organic layer 270 is removed. In the present embodiment, to remove a portion of the inorganic layer 290 above the organic layer 270, for example, first, a patterned photoresist layer 292 having an opening 294 is formed over the inorganic layer 290, wherein the opening 294 exposes the portion of the inorganic layer 290 directly above the bonding pad 240. Next, a dry etching using a fluorine-containing gas as etching gas is performed to remove the portion the inorganic layer 290 using the patterned photoresist layer 292 as a mask. Next, the patterned photoresist layer 292 is removed.

Since the material of the organic layer 270 can be a photoresist material, in the present embodiment, the organic layer 270 may be removed together with the patterned photoresist layer 292 to expose the bonding pad 240 to complete the fabrication of the optical device 300. The patterned photoresist layer 292 and the organic layer 270 may be removed by, for example, a dry etching process, however, the present invention as such is not limited thereto.

In the above-mentioned embodiments of the present invention, since the organic layer 270 is first formed to cover the bonding pad 240 before the formation of the inorganic layer 290, the bonding pad 240 can be effectively protected from being exposed to the fluorine-containing gas during etching of the inorganic layer 290, and therefore the possibility of damage to the bonding pad 240 may be effectively reduced.

In summary, during the fabrication of the optical device in accordance with the present invention, since an organic layer is first formed to cover the bonding pad before the formation of the inorganic layer, and therefore the bonding pad can be effectively protected from exposure to the fluorine-containing gas during the process of etching the inorganic layer, and therefore the reliability of the electrical connection between the bonding pad and other element during subsequent wire bonding process may be effectively improved.

Furthermore, because the organic layer covering the bonding pad can be formed simultaneously together with the formation of the filter array, the planarizing layer and the micro-lens array, and thus an additional process step for forming the organic layer may be avoided. Thus, the cost of the fabrication process may be effectively reduced The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method for fabricating an optical device, comprising:
providing a semiconductor substrate having an element region with an element array including a plurality of semiconductor elements formed therein and a peripheral region including at least a bonding pad electrically connected to the element array;
forming a dielectric layer over the semiconductor substrate, wherein the dielectric layer comprises an opening exposing the bonding pad;
forming a filter array corresponding to the element array over the dielectric layer;
forming a planarizing layer to cover the dielectric layer and the filter array;
filling an organic layer into the opening to cover the bonding pad;
forming an inorganic layer over the planarizing layer and covering the organic layer;
removing a portion of the inorganic layer to expose the organic layer; and
removing the organic layer to expose the bonding pad.

2. The method as claimed in claim 1, further comprising a step of forming a micro-lens array over the planarizing layer before the step of forming the inorganic layer, wherein the inorganic layer covers the micro-lens array.

3. The method as claimed in claim 2, wherein the organic layer is filled into the opening during at least one of the steps of forming the filter array, the planarizing layer and the micro-lens array, and wherein a material of the organic layer is the same as that of at least one of the filter array, the planarizing layer and the micro-lens array.

4. The method as claimed in claim 2, wherein the step of forming the micro-lens array comprises:
forming a patterned polymer layer over the planarizing layer; and
performing a drying process over the patterned polymer layer to form the micro-lens array.

5. The method as claimed in claim 2, wherein the organic layer is filled into the opening after the step of forming the micro-lens array.

6. The method as claimed in claim 2, wherein the organic layer is filled into the opening before the step of forming the micro-lens array.

7. The method as claimed in claim 6, wherein the organic layer is filled into the opening after the step of forming the planarizing layer.

8. The method as claimed in claim 1, wherein the organic layer is filled into the opening before the step of forming the planarizing layer.

9. The method as claimed in claim 8, wherein the organic layer is filled into the opening before the step of forming the filter array.

10. The method as claimed in claim 8, wherein the organic layer is filled into the opening after the step of forming the filter array.

11. The method as claimed in claim 1, wherein the semiconductor elements comprise photosensitive elements.

12. The method as claimed in claim 1, wherein the semiconductor elements comprise CMOS transistors.

13. The method as claimed in claim 1, wherein the element region of the semiconductor substrate further comprises a plurality of insulation structures formed therein, and the insulation structures are arranged between the respective semiconductor elements.

14. The method as claimed in claim 13, wherein a process for forming the insulation structures comprises a shallow trench insulation process.

15. The method as claimed in claim 1, wherein the filter array comprises a plurality of red filter patterns, a plurality of green filter patterns and a plurality of blue filter patterns.

16. The method as claimed in claim 15, wherein the organic layer is filled into the opening during at least one of steps of forming the red filter patterns, the green filter patterns and the blue filter patterns, and the material of the organic layer is the same as the material of at least one of the red filter patterns, the green filter patterns and the blue filter patterns.

17. The method as claimed in claim 1, wherein the step of removing the portion of the inorganic layer comprises:
    forming a patterned photoresist layer over the inorganic layer, wherein the patterned photoresist layer exposes a portion of the inorganic layer over the opening;
    etching the portion of the inorganic layer over the opening using the patterned photoresist layer as a mask; and
    removing the patterned photoresist layer.

18. The method as claimed in claim 17, wherein a fluorine-containing gas as etching gas is used for etching the portion of the inorganic layer over the opening.

19. The method as claimed in claim 17, wherein the patterned photoresist layer and the organic layer are removed in the same process.

20. The method as claimed in claim 1, wherein a process for removing the organic layer comprises a dry etching process.

* * * * *